(12) United States Patent
Klang

(10) Patent No.: US 7,619,417 B2
(45) Date of Patent: Nov. 17, 2009

(54) BATTERY MONITORING SYSTEM

(75) Inventor: James K. Klang, Wheaton, IL (US)

(73) Assignee: Midtronics, Inc., Willowbrook, IL (US)

( * ) Notice: Subject to any disclaimer, the term of this patent is extended or adjusted under 35 U.S.C. 154(b) by 224 days.

(21) Appl. No.: 11/638,771

(22) Filed: Dec. 14, 2006

(65) Prior Publication Data

US 2007/0090844 A1 Apr. 26, 2007

Related U.S. Application Data

(63) Continuation-in-part of application No. 10/748,792, filed on Dec. 30, 2003, now Pat. No. 7,208,914.

(60) Provisional application No. 60/437,255, filed on Dec. 31, 2002, provisional application No. 60/437,611, filed on Jan. 2, 2003.

(51) Int. Cl.
*G01N 27/416* (2006.01)

(52) U.S. Cl. .................. 324/427; 320/132; 324/426

(58) Field of Classification Search ............ 324/426, 324/427; 320/132
See application file for complete search history.

(56) References Cited

U.S. PATENT DOCUMENTS

| | | | |
|---|---|---|---|
| 2,000,665 A | 5/1935 | Neal | 439/440 |
| 2,514,745 A | 7/1950 | Dalzell | 324/115 |
| 3,267,452 A | 8/1966 | Wolf | 340/249 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |

(Continued)

FOREIGN PATENT DOCUMENTS

DE 29 26 716 B1 1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Edward Tso
*Assistant Examiner*—Samuel Berhanu
(74) *Attorney, Agent, or Firm*—Alan G. Rego; Westman, Champlin & Kelly, P.A.

(57) ABSTRACT

A battery monitoring system (BMS), which utilizes a minimum amount of input data (time, voltage, current, temperature and conductance, for example) to periodically determine a vehicle battery status or condition is provided. The BMS combines electronic hardware and software to give logical and critical data to assess and control a battery-based electrical system. The BMS can include processing circuitry (a microprocessor, for example), which is coupled to a voltage sensor, a current sensor, a temperature sensor, etc., that provide the necessary input data for the microprocessor, which executes program code, to determine the vehicle battery status or condition. A method of monitoring a battery in an operating vehicle is also provided.

20 Claims, 2 Drawing Sheets

U.S. PATENT DOCUMENTS

| | | | |
|---|---|---|---|
| 3,753,094 A | 8/1973 | Furuishi et al. ............. 324/430 |
| 3,796,124 A | 3/1974 | Crosa ........................ 411/521 |
| 3,808,522 A | 4/1974 | Sharaf ........................ 324/430 |
| 3,811,089 A | 5/1974 | Strezelewicz ............... 324/170 |
| 3,850,490 A | 11/1974 | Zehr ........................... 439/822 |
| 3,873,911 A | 3/1975 | Champlin ................... 324/430 |
| 3,876,931 A | 4/1975 | Godshalk ................... 324/429 |
| 3,886,443 A | 5/1975 | Miyakawa et al. .......... 324/426 |
| 3,889,248 A | 6/1975 | Ritter ..................... 340/636.11 |
| 3,906,329 A | 9/1975 | Bader ......................... 320/134 |
| 3,909,708 A | 9/1975 | Champlin ................... 324/431 |
| 3,936,744 A | 2/1976 | Perlmutter .................. 324/772 |
| 3,946,299 A | 3/1976 | Christianson et al. ....... 320/430 |
| 3,947,757 A | 3/1976 | Grube et al. ................ 324/416 |
| 3,969,667 A | 7/1976 | McWilliams ................ 324/427 |
| 3,979,664 A | 9/1976 | Harris ........................ 324/397 |
| 3,984,762 A | 10/1976 | Dowgiallo, Jr. ............. 324/430 |
| 3,984,768 A | 10/1976 | Staples ....................... 324/712 |
| 3,989,544 A | 11/1976 | Santo ........................... 429/65 |
| 4,008,619 A | 2/1977 | Alcaide et al. ................ 73/724 |
| 4,023,882 A | 5/1977 | Pettersson .................. 439/426 |
| 4,024,953 A | 5/1977 | Nailor, III ................... 206/344 |
| 4,047,091 A | 9/1977 | Hutchines et al. ............ 363/59 |
| 4,053,824 A | 10/1977 | Dupuis et al. ............... 324/434 |
| 4,056,764 A | 11/1977 | Endo et al. .................. 320/101 |
| 4,057,313 A | 11/1977 | Polizzano ................... 439/219 |
| 4,070,624 A | 1/1978 | Taylor ........................ 324/772 |
| 4,086,531 A | 4/1978 | Bernier ....................... 324/772 |
| 4,106,025 A | 8/1978 | Katz ........................... 343/715 |
| 4,112,351 A | 9/1978 | Back et al. .................. 324/380 |
| 4,114,083 A | 9/1978 | Benham et al. ........ 340/636.13 |
| 4,126,874 A | 11/1978 | Suzuki et al. ............... 396/301 |
| 4,160,916 A | 7/1979 | Papasideris ............... 307/10.6 |
| 4,178,546 A | 12/1979 | Hulls et al. .................. 324/772 |
| 4,193,025 A | 3/1980 | Frailing et al. .............. 324/427 |
| 4,207,611 A | 6/1980 | Gordon ........................ 701/33 |
| 4,217,645 A | 8/1980 | Barry et al. .................. 702/63 |
| 4,280,457 A | 7/1981 | Bloxham ................. 123/198 R |
| 4,297,639 A | 10/1981 | Branham .................... 324/429 |
| 4,307,342 A | 12/1981 | Peterson .................... 324/767 |
| 4,315,204 A | 2/1982 | Sievers et al. ................ 322/28 |
| 4,316,185 A | 2/1982 | Watrous et al. ........ 340/636.11 |
| 4,322,685 A | 3/1982 | Frailing et al. .............. 324/429 |
| 4,351,405 A | 9/1982 | Fields et al. ................ 180/65.2 |
| 4,352,067 A | 9/1982 | Ottone ....................... 324/434 |
| 4,360,780 A | 11/1982 | Skutch, Jr. .................. 324/437 |
| 4,361,809 A | 11/1982 | Bil et al. ..................... 324/426 |
| 4,363,407 A | 12/1982 | Buckler et al. ............... 209/3.3 |
| 4,369,407 A | 1/1983 | Korbell ...................... 324/416 |
| 4,379,989 A | 4/1983 | Kurz et al. .................. 320/165 |
| 4,379,990 A | 4/1983 | Sievers et al. ................. 322/99 |
| 4,385,269 A | 5/1983 | Aspinwall et al. ........... 320/129 |
| 4,390,828 A | 6/1983 | Converse et al. ............ 320/153 |
| 4,392,101 A | 7/1983 | Saar et al. ................... 320/156 |
| 4,396,880 A | 8/1983 | Windebank ................. 320/156 |
| 4,408,157 A | 10/1983 | Beaubien ................... 324/712 |
| 4,412,169 A | 10/1983 | Dell'Orto ................... 320/123 |
| 4,423,378 A | 12/1983 | Marino et al. .............. 324/427 |
| 4,423,379 A | 12/1983 | Jacobs et al. ............... 324/429 |
| 4,424,491 A | 1/1984 | Bobbett et al. .............. 324/433 |
| 4,459,548 A | 7/1984 | Lentz et al. ................. 324/472 |
| 4,514,694 A | 4/1985 | Finger ........................ 324/429 |
| 4,520,353 A | 5/1985 | McAuliffe ............. 340/636.16 |
| 4,521,498 A | 6/1985 | Juergens ....................... 429/59 |
| 4,564,798 A | 1/1986 | Young ........................ 320/103 |
| 4,620,767 A | 11/1986 | Woolf ........................ 439/217 |
| 4,633,418 A | 12/1986 | Bishop ........................ 702/63 |
| 4,637,359 A | 1/1987 | Cook .......................... 123/179 |
| 4,659,977 A | 4/1987 | Kissel et al. ................. 320/150 |
| 4,663,580 A | 5/1987 | Wortman .................... 320/153 |
| 4,665,370 A | 5/1987 | Holland ...................... 324/429 |
| 4,667,143 A | 5/1987 | Cooper et al. ............... 320/153 |
| 4,667,279 A | 5/1987 | Maier .......................... 363/46 |
| 4,678,998 A | 7/1987 | Muramatsu ................. 324/427 |
| 4,679,000 A | 7/1987 | Clark ......................... 324/428 |
| 4,680,528 A | 7/1987 | Mikami et al. .............. 320/165 |
| 4,686,442 A | 8/1987 | Radomski ................... 320/123 |
| 4,697,134 A | 9/1987 | Burkum et al. ............. 320/134 |
| 4,707,795 A | 11/1987 | Alber et al. ................... 702/63 |
| 4,709,202 A | 11/1987 | Koenck et al. .............. 320/112 |
| 4,710,861 A | 12/1987 | Kanner ........................ 363/46 |
| 4,719,428 A | 1/1988 | Liebermann ................ 324/436 |
| 4,723,656 A | 2/1988 | Kiernan et al. .............. 206/705 |
| 4,743,855 A | 5/1988 | Randin et al. ............... 324/430 |
| 4,745,349 A | 5/1988 | Palanisamy et al. ......... 320/125 |
| 4,781,629 A | 11/1988 | Mize .......................... 439/822 |
| 4,816,768 A | 3/1989 | Champlin ................... 324/428 |
| 4,820,966 A | 4/1989 | Fridman ..................... 320/116 |
| 4,825,170 A | 4/1989 | Champlin ................... 324/436 |
| 4,847,547 A | 7/1989 | Eng, Jr. et al. .............. 320/153 |
| 4,849,700 A | 7/1989 | Morioka et al. ............. 324/427 |
| 4,874,679 A | 10/1989 | Miyagawa .................... 429/91 |
| 4,876,495 A | 10/1989 | Palanisamy et al. ......... 320/106 |
| 4,881,038 A | 11/1989 | Champlin ................... 324/426 |
| 4,888,716 A | 12/1989 | Ueno .......................... 702/63 |
| 4,907,176 A | 3/1990 | Bahnick et al. ......... 364/551.01 |
| 4,912,416 A | 3/1990 | Champlin ................... 324/430 |
| 4,913,116 A | 4/1990 | Katogi et al. ........... 123/406.32 |
| 4,926,330 A | 5/1990 | Abe et al. ...................... 701/33 |
| 4,929,931 A | 5/1990 | McCuen ................. 340/636.15 |
| 4,931,738 A | 6/1990 | MacIntyre et al. .......... 324/435 |
| 4,932,905 A | 6/1990 | Richards .................... 439/822 |
| 4,933,845 A | 6/1990 | Hayes ......................... 710/104 |
| 4,934,957 A | 6/1990 | Bellusci ..................... 439/504 |
| 4,937,528 A | 6/1990 | Palanisamy ................. 324/430 |
| 4,947,124 A | 8/1990 | Hauser ....................... 324/430 |
| 4,949,046 A | 8/1990 | Seyfang ...................... 324/427 |
| 4,956,597 A | 9/1990 | Heavey et al. .............. 320/129 |
| 4,968,941 A | 11/1990 | Rogers ....................... 324/428 |
| 4,968,942 A | 11/1990 | Palanisamy ................. 324/430 |
| 4,969,834 A | 11/1990 | Johnson ..................... 439/141 |
| 4,983,086 A | 1/1991 | Hatrock ...................... 411/259 |
| 5,004,979 A | 4/1991 | Marino et al. .............. 324/160 |
| 5,032,825 A | 7/1991 | Kuznicki ................ 340/636.15 |
| 5,037,778 A | 8/1991 | Stark et al. .................. 228/121 |
| 5,047,722 A | 9/1991 | Wurst et al. ................. 324/430 |
| 5,081,565 A | 1/1992 | Nabha et al. ................ 362/465 |
| 5,087,881 A | 2/1992 | Peacock ..................... 324/378 |
| 5,095,223 A | 3/1992 | Thomas ...................... 307/110 |
| 5,108,320 A | 4/1992 | Kimber ....................... 439/883 |
| 5,126,675 A | 6/1992 | Yang .......................... 324/435 |
| 5,130,658 A | 7/1992 | Bohmer ...................... 324/435 |
| 5,140,269 A | 8/1992 | Champlin ................... 324/433 |
| 5,144,218 A | 9/1992 | Bosscha ..................... 320/139 |
| 5,144,248 A | 9/1992 | Alexandres et al. ......... 324/428 |
| 5,159,272 A | 10/1992 | Rao et al. .................... 324/429 |
| 5,160,881 A | 11/1992 | Schramm et al. .............. 322/7 |
| 5,168,208 A | 12/1992 | Schultz et al. ................ 322/25 |
| 5,170,124 A | 12/1992 | Blair et al. .................. 324/434 |
| 5,179,335 A | 1/1993 | Nor ............................ 320/159 |
| 5,194,799 A | 3/1993 | Tomantschger ............. 320/103 |
| 5,204,611 A | 4/1993 | Nor et al. .................... 320/145 |
| 5,214,370 A | 5/1993 | Harm et al. ................. 320/152 |
| 5,214,385 A | 5/1993 | Gabriel et al. .............. 324/434 |
| 5,241,275 A | 8/1993 | Fang .......................... 324/430 |
| 5,254,952 A | 10/1993 | Salley et al. ................ 324/429 |
| 5,266,880 A | 11/1993 | Newland .................... 320/125 |
| 5,281,919 A | 1/1994 | Palanisamy ................. 324/427 |
| 5,281,920 A | 1/1994 | Wurst ........................ 324/430 |
| 5,295,078 A | 3/1994 | Stich et al. .................. 700/297 |
| 5,298,797 A | 3/1994 | Redl .......................... 327/387 |
| 5,300,874 A | 4/1994 | Shimamoto et al. ......... 320/106 |
| 5,302,902 A | 4/1994 | Groehl ....................... 324/434 |
| 5,313,152 A | 5/1994 | Wozniak et al. ............ 320/118 |

| Patent No. | Date | Inventor | Class |
|---|---|---|---|
| 5,315,287 A | 5/1994 | Sol | 340/455 |
| 5,321,626 A | 6/1994 | Palladino | 702/63 |
| 5,321,627 A | 6/1994 | Reher | 702/63 |
| 5,323,337 A | 6/1994 | Wilson et al. | 702/73 |
| 5,325,041 A | 6/1994 | Briggs | 320/149 |
| 5,331,268 A | 7/1994 | Patino et al. | 320/158 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,357,519 A | 10/1994 | Martin et al. | 371/15.1 |
| 5,365,160 A | 11/1994 | Leppo et al. | 320/160 |
| 5,365,453 A | 11/1994 | Startup et al. | 702/36 |
| 5,369,364 A | 11/1994 | Renirie et al. | 324/430 |
| 5,381,096 A | 1/1995 | Hirzel | 324/427 |
| 5,410,754 A | 4/1995 | Klotzbach et al. | 370/466 |
| 5,412,308 A | 5/1995 | Brown | 323/267 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,025 A | 7/1995 | Cox | 429/65 |
| 5,432,426 A | 7/1995 | Yoshida | 320/160 |
| 5,434,495 A | 7/1995 | Toko | 320/135 |
| 5,435,185 A | 7/1995 | Eagan | 73/587 |
| 5,438,249 A * | 8/1995 | Chang et al. | 320/127 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,453,027 A | 9/1995 | Buell et al. | 439/433 |
| 5,457,377 A | 10/1995 | Jonsson | 324/430 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636.15 |
| 5,528,148 A | 6/1996 | Rogers | 320/137 |
| 5,537,967 A | 7/1996 | Tashiro et al. | 123/192.1 |
| 5,541,489 A | 7/1996 | Dunstan | 320/134 |
| 5,546,317 A | 8/1996 | Andrieu | 702/63 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,563,496 A | 10/1996 | McClure | 320/128 |
| 5,572,136 A | 11/1996 | Champlin | 324/426 |
| 5,574,355 A | 11/1996 | McShane et al. | 320/161 |
| 5,578,915 A | 11/1996 | Crouch, Jr. et al. | 324/428 |
| 5,583,416 A | 12/1996 | Klang | 320/160 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,592,094 A | 1/1997 | Ichikawa | 324/427 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,614,788 A | 3/1997 | Mullins et al. | 315/82 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/104 |
| 5,642,031 A | 6/1997 | Brotto | 320/156 |
| 5,650,937 A | 7/1997 | Bounaga | 702/65 |
| 5,652,501 A | 7/1997 | McClure et al. | 340/636.15 |
| 5,653,659 A | 8/1997 | Kunibe et al. | 477/111 |
| 5,654,623 A | 8/1997 | Shiga et al. | 320/106 |
| 5,656,920 A | 8/1997 | Cherng et al. | 324/431 |
| 5,661,368 A | 8/1997 | Deol et al. | 315/82 |
| 5,675,234 A | 10/1997 | Greene | 340/636.11 |
| 5,677,077 A | 10/1997 | Faulk | 429/90 |
| 5,699,050 A | 12/1997 | Kanazawa | 340/636.13 |
| 5,701,089 A | 12/1997 | Perkins | 324/772 |
| 5,705,929 A | 1/1998 | Caravello et al. | 324/430 |
| 5,707,015 A | 1/1998 | Guthrie | 241/120 |
| 5,710,503 A | 1/1998 | Sideris et al. | 320/116 |
| 5,711,648 A | 1/1998 | Hammerslag | 414/800 |
| 5,717,336 A | 2/1998 | Basell et al. | 324/430 |
| 5,717,937 A | 2/1998 | Fritz | 713/300 |
| 5,739,667 A | 4/1998 | Matsuda et al. | 320/128 |
| 5,745,044 A | 4/1998 | Hyatt, Jr. et al. | 340/5.23 |
| 5,747,909 A | 5/1998 | Syverson et al. | 310/156.56 |
| 5,747,967 A | 5/1998 | Muljadi et al. | 320/148 |
| 5,754,417 A | 5/1998 | Nicollini | 363/60 |
| 5,757,192 A | 5/1998 | McShane et al. | 324/427 |
| 5,760,587 A | 6/1998 | Harvey | 324/434 |
| 5,772,468 A | 6/1998 | Kowalski et al. | 439/506 |
| 5,773,978 A | 6/1998 | Becker | 324/430 |
| 5,780,974 A | 7/1998 | Pabla et al. | 315/82 |
| 5,780,980 A | 7/1998 | Naito | 318/139 |
| 5,789,899 A | 8/1998 | van Phuoc et al. | 320/112 |
| 5,793,359 A | 8/1998 | Ushikubo | 345/169 |
| 5,796,239 A | 8/1998 | van Phuoc et al. | 320/107 |
| 5,808,469 A | 9/1998 | Kopera | 324/434 |
| 5,811,979 A | 9/1998 | Rhein | 324/718 |
| 5,818,234 A | 10/1998 | McKinnon | 324/433 |
| 5,821,756 A | 10/1998 | McShane et al. | 324/430 |
| 5,821,757 A | 10/1998 | Alvarez et al. | 324/434 |
| 5,825,174 A | 10/1998 | Parker | 324/106 |
| 5,831,435 A | 11/1998 | Troy | 324/426 |
| 5,850,113 A | 12/1998 | Weimer et al. | 307/125 |
| 5,862,515 A | 1/1999 | Kobayashi et al. | 702/63 |
| 5,865,638 A | 2/1999 | Trafton | 439/288 |
| 5,872,443 A | 2/1999 | Williamson | 320/160 |
| 5,872,453 A | 2/1999 | Shimoyama et al. | 324/431 |
| 5,895,440 A | 4/1999 | Proctor et al. | 702/63 |
| 5,903,154 A | 5/1999 | Zhang et al. | 324/437 |
| 5,903,716 A | 5/1999 | Kimber et al. | 395/114 |
| 5,912,534 A | 6/1999 | Benedict | 315/82 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636.19 |
| 5,978,805 A | 11/1999 | Carson | 707/10 |
| 5,982,138 A | 11/1999 | Krieger | 320/105 |
| 6,002,238 A | 12/1999 | Champlin | 320/134 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,081,098 A | 6/2000 | Bertness et al. | 320/134 |
| 6,081,109 A | 6/2000 | Seymour et al. | 324/127 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |

| Patent | Date | Inventor | Class |
|---|---|---|---|
| 6,100,670 A | 8/2000 | Levesque | 320/150 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,211,651 B1 | 4/2001 | Nemoto | 320/133 |
| 6,215,275 B1 | 4/2001 | Bean | 320/106 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,236,332 B1 | 5/2001 | Conkright et al. | 340/3.1 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/132 |
| 6,263,268 B1 | 7/2001 | Nathanson | 701/29 |
| 6,271,643 B1 | 8/2001 | Becker et al. | 320/112 |
| 6,275,008 B1 | 8/2001 | Arai et al. | 320/132 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,384,608 B1 | 5/2002 | Namaky | 324/430 |
| 6,388,448 B1 | 5/2002 | Cervas | 324/426 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,424,157 B1 | 7/2002 | Gollomp et al. | 324/430 |
| 6,424,158 B2 | 7/2002 | Klang | 324/433 |
| 6,441,585 B1 | 8/2002 | Bertness | 320/132 |
| 6,445,158 B1 | 9/2002 | Bertness et al. | 320/104 |
| 6,449,726 B1 | 9/2002 | Smith | 713/340 |
| 6,456,045 B1 | 9/2002 | Troy et al. | 320/139 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,469,512 B2 | 10/2002 | Singh et al. | 324/426 |
| 6,477,478 B1 | 11/2002 | Jones et al. | 702/102 |
| 6,495,990 B2 | 12/2002 | Champlin | 320/132 |
| 6,500,025 B1 | 12/2002 | Moenkhaus et al. | 439/502 |
| 6,526,361 B1 | 2/2003 | Jones et al. | 702/63 |
| 6,531,848 B1 | 3/2003 | Chitsazan et al. | 320/153 |
| 6,532,425 B1 | 3/2003 | Boost et al. | 702/63 |
| 6,534,993 B2 | 3/2003 | Bertness | 324/433 |
| 6,544,078 B2 | 4/2003 | Palmisano et al. | 439/762 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,600,815 B1 | 7/2003 | Walding | 379/93.07 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,737,831 B2 | 5/2004 | Champlin | 320/132 |
| 6,740,990 B2 | 5/2004 | Tozuka et al. | 307/9.1 |
| 6,759,849 B2 | 7/2004 | Bertness | 324/426 |
| 6,777,945 B2 | 8/2004 | Roberts et al. | 324/426 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,842,707 B2 | 1/2005 | Raichle et al. | 702/62 |
| 6,850,037 B2 | 2/2005 | Bertness | 320/132 |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,941,234 B2 | 9/2005 | Bertness et al. | 702/63 |
| 7,119,686 B2 | 10/2006 | Bertness et al. | 340/572.1 |
| 2002/0010558 A1 | 1/2002 | Bertness et al. | 702/63 |
| 2002/0171428 A1 | 11/2002 | Bertness | 702/63 |
| 2002/0176010 A1 | 11/2002 | Wallach et al. | 348/362 |
| 2003/0025481 A1 | 2/2003 | Bertness | 324/427 |
| 2003/0036909 A1 | 2/2003 | Kato | 704/275 |
| 2003/0169018 A1 | 9/2003 | Berels et al. | 320/132 |
| 2003/0184262 A1 | 10/2003 | Makhija | 320/156 |
| 2003/0184306 A1 | 10/2003 | Bertness et al. | 324/426 |
| 2003/0194672 A1 | 10/2003 | Roberts et al. | 431/196 |
| 2004/0000590 A1 | 1/2004 | Raichle et al. | 235/462.01 |
| 2004/0000893 A1 | 1/2004 | Raichle et al. | 320/135 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/182 |
| 2004/0113588 A1 | 6/2004 | Mikuriya et al. | 320/128 |
| 2004/0145342 A1 | 7/2004 | Lyon | 320/108 |
| 2004/0178185 A1 | 9/2004 | Yoshikawa et al. | 219/270 |

| | | |
|---|---|---|
| 2005/0254106 A9 | 11/2005 | Silverbrook et al. ........ 358/539 |

FOREIGN PATENT DOCUMENTS

| | | |
|---|---|---|
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

"Battery Impedance", by E. Willihnganz et al., *Electrical Engineering*, Sep. 1959, pp. 922-925.
"Determining the End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated lead Acid Batteries: Part I Conductance/Capacity Correlation Studies", by D. Feder et al., *IEEE*, Aug. 1992, pp. 218-233.
"JIS Japanese Industrial Standard-Lead Acid Batteries for Automobiles", *Japanese Standards Association UDC*, 621.355.2:629.113.006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Willhncanz, *The Electrochemical Society*, preprint 79-20, Apr. 1941, pp. 253-258.
National Semiconductor Corporation, "High Q Notch Filter", Mar. 1969, Linear Brief 5.
Burr-Brown Corporation, "Design A 60 Hz Notch Filter with the UAF42", Jan. 1994, AB-071.
National Semiconductor Corporation, "LMF90-$4^{th}$-Order Elliptic Notch Filter", Dec. 1994, RRD-B30M115.
"Alligator Clips with Wire Penetrators" *J.S. Popper, Inc.* product information, downloaded from http://www.jspopper.com/, undated.
"#12: LM78S40 Simple Switcher DC to DC Converter", *ITM e-Catalog*, downloaded from http://www.pcbcafe.com, undated.
"Simple DC-DC Converts Allows Use of Single Battery", *Electronix Express*, downloaded from http://www.elexp.com/t_dc-dc.htm, undated.
"DC-DC Converter Basics", *Power Designers*, downloaded from http://www.powederdesigners.com/InforWeb.design_center/articles/DC-DC/converter.shtm, undated.
"Notification of Transmittal of The International Search Report or the Declaration", PCT/US02/29461.
"Notification of Transmittal of The International Search Report or the Declaration", PCT/US03/07546.
"Notification of Transmittal of The International Search Report or the Declaration", PCT/US03/06577.
"Notification of Transmittal of The International Search Report or the Declaration", PCT/US03/07837.
"Improved Impedance Spectroscopy Technique For Status Determination of Production Li/$SO_2$ Batteries" Terrill Atwater et al., pp. 10-113, (1992).
"Notification of Transmittal of The International Search Report or the Declaration", PCT/US03/41561.
"Notification of Transmittal of The International Search Report or the Declaration", PCT/US03/27696.
"Programming Training Course, 62-000 Series Smart Engine Analyzer", Testproducts Division, Kalamazoo, Michigan, pp. 1-207, (1984).
"Operators manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2.
"Dynamic modelling of lead/acid batteries using impedance spectroscopy for parameter identification", Journal of Power Sources, pp. 69-84, (1997).
Notification of Transmittal of the International Search Report for PCT/US03/30707.
"A review of impedance measurements for determination of the state-of-charge or state-of-health of secondary batteries", Journal of Power Sources, pp. 59-69, (1998).
"Search Report Under Section 17" for Great Britain Application No. GB0421447.4.
"Results of Discrete Frequency Immittance Spectroscopy (DFIS) Measurements of Lead Acid Batteries", by K.S. Champlin et al., *Proceedings of $23^{rd}$ International Teleco Conference (INTELEC)*, published Oct. 2001, IEE, pp. 433-440.
"Examination Report" from the U.K. Patent Office for U.K. App. No. 0417678.0.
Wikipedia Online Encyclopedia, Inductance, 2005, http://en.wikipedia.org/wiki/inductance, pp. 1-5, mutual Inductance, pp. 3,4.

* cited by examiner

BATTERY MONITORING SYSTEM

CROSS-REFERENCE TO RELATED APPLICATIONS

The present application is a Continuation-In-Part of and claims priority of U.S. patent application Ser. No. 10/748,792, filed Dec. 30, 2003, which claims the benefit of U.S. provisional patent application Ser. No. 60/437,255, filed Dec. 31, 2002; and U.S. provisional patent application Ser. No. 60/437,611, filed Jan. 2, 2003, the contents of which are hereby incorporated by reference in their entirety.

FIELD OF THE INVENTION

The present embodiments relate to vehicle batteries. More specifically, the present embodiments relate to battery monitors used to monitor batteries employed in vehicles.

BACKGROUND OF THE INVENTION

Vehicles, both automotive and electric, typically include a storage battery. For example, automotive vehicles powered by internal combustion engines typically include a battery for starting. The battery is also used to power the electrical system when the engine is not running. Additionally, the vehicle alternator powered by the engine is used to charge the battery and to power electrical components of the vehicle when the engine is running. While there are many devices used to measure vehicle batteries, most do not do so while the battery is in continuous service or without interfering with the function of the vehicle.

Various aspects of battering testing and related technologies have been pioneered by Midtronics, Inc. of Willowbrook, Ill. and Dr. Keith S. Champlin as shown and described in:

U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER DEVICE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,871,858, issued Feb. 16, 1999, entitled ANTI-THEFT BATTERY; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF- IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM; U.S. Pat. No. 6,377,031, issued Apr. 23, 2002, entitled INTELLIGENT SWITCH FOR POWER MANAGEMENT; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,465,908, issued Oct. 15, 2002, entitled INTELLIGENT POWER MANAGEMENT SYSTEM; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,469,511, issued Nov. 22, 2002, entitled BATTERY CLAMP WITH EMBEDDED ENVIRONMENT SENSOR; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Pat. No. 6,497,209, issued Dec. 24, 2002, entitled SYSTEM AND METHOD FOR PROTECTING A CRANKING SUBSYSTEM; U.S. Pat. No. 6,507,196, issued Jan. 14, 2003; entitled BATTERY HAVING DISCHARGE STATE INDICATION; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Pat. No. 6,707,303, issued Mar. 16, 2004, entitled ELECTRONIC BATTERY TESTER; U.S. Pat. No. 6,737,831, issued May 18, 2004, entitled METHOD AND APPARATUS USING A CIRCUIT MODEL TO EVALUATE CELL/BATTERY PARAMETERS; U.S. Pat. No. 6,744,149, issued Jun. 1, 2004, entitled SYSTEM AND METHOD FOR PROVIDING STEP-DOWN POWER CONVERSION USING AN INTELLIGENT SWITCH; U.S. Pat. No. 6,759,849, issued Jul. 6, 2004, entitled BATTERY TESTER CONFIGURED TO RECEIVE A REMOVABLE DIGITAL MODULE; U.S. Pat. No. 6,781,382, issued Aug. 24, 2004, entitled ELECTRONIC BATTERY TESTER; U.S. Pat. No. 6,788,025, filed Sep. 7, 2004, entitled BATTERY CHARGER WITH BOOSTER PACK; U.S. Pat. No. 6,795,782, issued Sep. 21, 2004, entitled BATTERY TEST MODULE; U.S. Pat. No. 6,805,090, filed Oct. 19, 2004, entitled CHARGE CONTROL SYSTEM FOR A VEHICLE BATTERY; U.S. Pat. No. 6,806,716, filed Oct. 19, 2004, entitled ELECTRONIC BATTERY TESTER; U.S. Pat. No. 6,850,037, filed Feb. 1, 2005, entitled IN-VEHICLE BATTERY MONITORING; U.S. Pat. No. 6,850,037, issued Feb. 1, 2005, entitled IN-VEHICLE BATTERY MONITOR; U.S. Pat. No. 6,871,151, issued Mar. 22, 2005, entitled ELECTRONIC BATTERY TESTER WITH NETWORK COMMUNICATION; U.S. Pat. No. 6,885,195, issued Apr. 26, 2005, entitled METHOD AND APPARATUS FOR AUDITING A BATTERY TEST; U.S. Pat. No. 6,888,468, issued May 3, 2005, entitled APPARATUS AND METHOD FOR PROTECTING A BATTERY FROM OVERDISCHARGE; U.S. Pat. No. 6,891,378, issued May 10, 2005, entitled ELECTRONIC BATTERY TESTER; U.S. Pat. No. 6,906,522, issued Jun. 14, 2005, entitled BATTERY TESTER WITH BATTERY REPLACEMENT OUTPUT; U.S. Pat. No. 6,906,523, issued Jun. 14, 2005, entitled METHOD AND APPARATUS FOR TESTING CELLS AND BATTERIES EMBEDDED IN SERIES/PARALLEL SYSTEMS; U.S. Pat. No. 6,909,287, issued Jun. 21, 2005, entitled ENERGY MANAGEMENT SYSTEM WITH AUTOMOTIVE VEHICLE; U.S. Pat. No. 6,914,413, issued Jul. 5, 2005, entitled ALTERNATOR TESTER WITH ENCODED OUTPUT; U.S. Pat. No. 6,913,483, issued Jul. 5, 2005, entitled CABLE FOR ELECTRONIC BATTERY TESTER; U.S. Pat. No. 6,930,485, issued Aug. 16, 2005, entitled ELECTRONIC BATTERY TESTER WITH BATTERY FAILURE TEMPERATURE DETERMINATION; U.S. Pat. No. 6,933,727, issued Aug. 23, 2005, entitled ELECTRONIC BATTERY TESTER CABLE, U.S. Pat. No. 6,941,234, filed Sep. 6, 2005, entitled QUERY BASED ELECTRONIC BATTERY TESTER; U.S. Pat. No. 6,967,484, issued Nov. 22, 2005, entitled MODULAR BATTERY TESTER FOR SCAN TOOL; U.S. Pat. No. 6,998,847, issued Feb. 14, 2006, entitled ELECTRONIC BATTERY TESTER WITH DATA BUS FOR REMOVABLE MODULE, U.S. Pat. No. 7,003,410, issued Feb. 21, 2006, entitled ELECTRONIC BATTERY TESTER WITH RELATIVE TEST OUTPUT, U.S. Pat. No. 7,003,411, issued Feb. 21, 2006, entitled ELECTRONIC BATTERY TESTER WITH NETWORK COMMUNICATION, U.S. Pat. No. 7,012,433, ISSUED Mar. 14, 2006, entitled BATTERY TESTER UPGRADE USING SOFTWARE KEY, U.S. Pat. No. 7,015,674, issued Mar. 21, 2006, entitled BOOSTER PACK WITH STORAGE CAPACITOR, U.S. Pat. No. 7,034,541, issued Apr. 25, 2006, entitled QUERY BASED ELECTRONIC BATTERY TESTER, U.S. Pat. No. 7,039,533, issued May 2, 2006, entitled BATTERY TESTER MODULE, U.S. Pat. No. 7,058,525, issued Jun. 6, 2006, entitled BATTERY TESTER MODULE, U.S. Pat. No. 7,081,755, issued Jul. 25, 2006, entitled BATTERY TEST CAPABLE OF PREDICTING A DISCHARGE VOLTAGE/DISCHARGE CURRENT OF A BATTERY; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 09/993,468, filed Nov. 14, 2001, entitled KELVIN CONNECTOR FOR A BATTERY POST; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; U.S. Ser. No. 10/783,682, filed Feb. 20, 2004, entitled REPLACEABLE CLAMP FOR ELECTRONIC BATTERY TESTER; U.S. Ser. No. 10/791,141, filed Mar. 2, 2004, entitled METHOD AND APPARATUS FOR AUDITING A BATTERY TEST; U.S. Ser. No. 10/823,140, filed Apr. 13, 2004, entitled THEFT PREVENTION DEVICE FOR AUTOMOTIVE VEHICLE SERVICE CENTERS; U.S. Ser. No. 10/864,904, filed Jun. 9, 2004, entitled ALTERNATOR TESTER; U.S. Ser. No. 10/867,385, filed Jun. 14, 2004, entitled ENERGY MANAGEMENT SYSTEM FOR AUTOMOTIVE VEHICLE; U.S. Ser. No. 10/896,835, filed Jul. 22, 2004, entitled BROAD-BAND LOW-INDUCTANCE CABLES FOR MAKING KELVIN CONNECTIONS TO ELECTROCHEMICAL CELLS AND BATTERIES; U.S. Ser. No. 10/896,834, filed Jul. 22, 2004, entitled ELECTRONIC BATTERY TESTER; U.S. Ser. No. 10/897,801, filed Jul. 23, 2004, entitled SHUNT CONNECTION TO A PCB FOR AN ENERGY MANAGEMENT SYSTEM EMPLOYED IN AN AUTOMOTIVE VEHICLE; U.S. Ser. No. 10/958,821, filed Oct. 5, 2004, entitled IN-VEHICLE BATTERY MONITOR; U.S. Ser. No. 10/958,812, filed Oct. 5, 2004, entitled SCAN TOOL FOR ELECTRONIC BATTERY TESTER; U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; U.S. Ser. No. 60/653,537, filed Feb. 16, 2005, entitled CUSTOMER MANAGED WARRANTY CODE; U.S. Ser. No. 11/063,247, filed Feb. 22, 2005, entitled ELECTRONIC BATTERY TESTER OR CHARGER WITH DATABUS CONNECTION; U.S. Ser. No. 60/665,070, filed Mar. 24, 2005, entitled OHMMETER PROTECTION CIRCUIT; U.S. Ser. No. 11/141,234, filed May 31, 2005, entitled BATTERY TESTER CAPABLE OF IDENTIFYING FAULTY BATTERY POST ADAPTERS; U.S. Ser. No. 11/143,828, filed Jun. 2, 2005, entitled BATTERY TEST MODULE; U.S. Ser. No. 11/146,608, filed Jun. 7, 2005, entitled SCAN TOOL FOR ELECTRONIC BATTERY TESTER; U.S. Ser. No. 60/694,199, filed Jun. 27, 2005, entitled GEL BATTERY CONDUCTANCE COMPENSATION; U.S. Ser. No. 11/178,550, filed Jul. 11, 2005, entitled WIRELESS BATTERY TESTER/CHARGER; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,169, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 11/304,004, filed Dec. 14, 2005, entitled BATTERY TESTER THAT CALCULATES ITS OWN REFERENCE VALUES; U.S. Ser. No. 60/751,853, filed Dec. 20, 2005, entitled BATTERY MONITORING SYSTEM; U.S. Ser. No. 11/304,004, filed Dec. 14, 2005, entitled BATTERY TESTER WITH CALCULATES ITS OWN REFERENCE VALUES; U.S. Ser. No. 60/751,853, filed Dec. 20, 2005, entitled BATTERY MONITORING SYSTEM; U.S. Ser. No. 11/352,945, filed Feb. 13, 2006, entitled BATTERY TESTERS WITH SECONDARY FUNCTIONALITY; U.S. Ser. No. 11/356,299, filed Feb. 16, 2006, entitled CENTRALLY MONITORED SALES OF STORAGE BATTERIES; U.S. Ser. No. 11/356,436, field Feb. 16, 2006, entitled ELECTRONIC BATTERY TESTER WITH RELATIVE TEST OUTPUT; U.S. Ser. No. 11/356,443, filed Feb. 16, 2006, entitled ELECTRONIC BATTERY TESTER WITH NETWORK COMMUNICATION; U.S. Ser. No. 11/410,263, filed Apr. 24, 2006, entitled QUERY BASED ELECTRONIC BATTERY TESTER; which are incorporated herein in their entirety.

SUMMARY OF THE INVENTION

A battery monitoring system (BMS), which utilizes a minimum amount of input data (time, voltage, current, temperature and conductance, for example) to periodically determine a vehicle battery status or condition is provided. The BMS combines electronic hardware and software to give logical and critical real-time data to control a battery-based electrical system. An example embodiment of the BMS includes processing circuitry (a microprocessor, for example), which is coupled to a voltage sensor, a current sensor, a temperature sensor, etc., that provide the necessary input data for the microprocessor, which executes program code, to determine the vehicle battery status or condition. A method of monitoring a battery in an operating vehicle is also provided.

DETAILED DESCRIPTION OF ILLUSTRATIVE EMBODIMENTS

The present embodiments offer a battery monitoring system (BMS) which is a combination of hardware and software designed to give real-time key information about battery status or condition in an operating vehicle. The BMS provides pertinent data that can be used by a vehicle operator, for example, to avoid battery and electrical system problems. Before describing the present embodiments in greater detail, certain common terms used in the description are defined below.

Voltage Related Terms

| | |
|---|---|
| V | Measured voltage from BMS |
| OCV | Estimated open circuit voltage |

Current Related Terms

| | |
|---|---|
| A | Measured current |

It should be noted that a minus sign preceding the measured current (−A) represents discharge.

Discharge Time Remaining Terms

| | |
|---|---|
| TR | Discharge time remaining in hours at average or working discharge current |
| TRcalc | Calculated time remaining from discharge parameters |

Discharge Related Terms

| | |
|---|---|
| DCHG | Calculated ampere-hour (Ah) discharge |
| Cycles | Discharge/charge operations based using 50% of rated Ah capacity |

Capacity Related Terms

| | |
|---|---|
| CAPw | Working capacity of battery at discharge rate and temperature |
| Cp | Capacity based on Peukert relationship |
| C20 | Ampere-hour capacity at a 20 hour discharge rate at 25 degrees Celsius |
| PN | Peukert number exponent |

Cranking Related Terms

| | |
|---|---|
| CCAconductance | Adjusted conductance cold cranking amperes (CCA) from BMS |
| CCAnom | Nominal CCA |
| CCArated | Rated CCA |
| CCAcomp | CCA reading compensated to 0 degrees Fahrenheit and adjusted to real CCA range |
| CCAfc | Estimated CCA at full charge |
| Vpred | Predicted instantaneous load voltage under present condition |
| VpredFC | Predicted instantaneous load test voltage at 70 degrees Fahrenheit and full charge |

State of Charge Related Terms

| | |
|---|---|
| SOC | State of charge at discharge rate and temperature (0-100) |

State of Health Related Terms

| | |
|---|---|
| RSOH | Reserve state of health (0-100) |
| CSOH | Cranking state of health (0-100) |
| SOL | State of life (0-100) |

Figure 1:
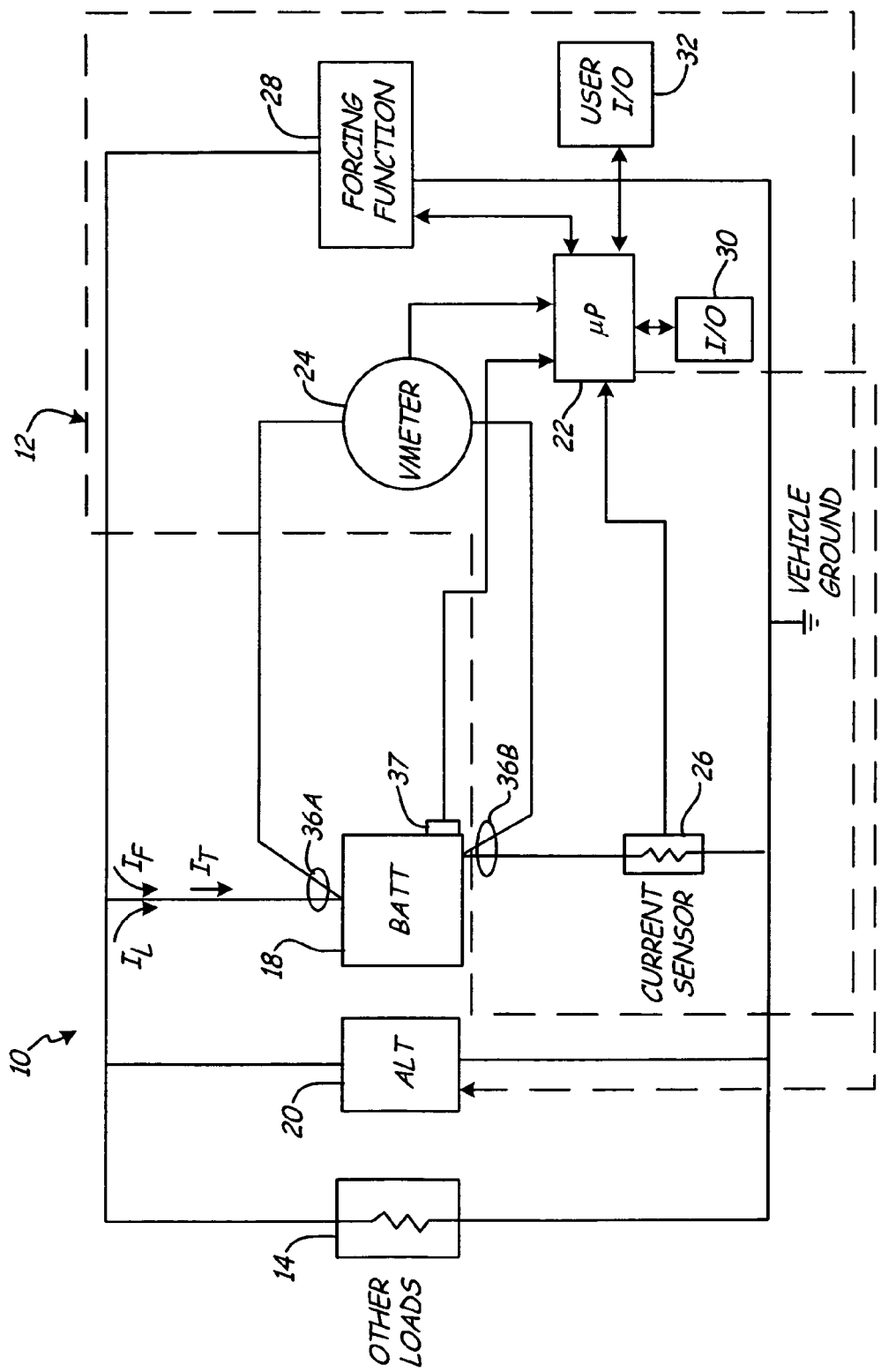
FIG. 1 is a simplified block diagram showing a battery monitoring system in accordance with one of the present embodiments.

FIG. 1 is a simplified block diagram showing an automotive vehicle 10 which includes an example BMS 12 in accordance with one of the present embodiments. Vehicle 10 includes vehicle loads 14 which are shown schematically as an electrical resistance. A battery 18 is coupled to vehicle load 14 and to an alternator 20. Alternator 20 couples to an engine of the vehicle 10 and is used to charge battery 18 and provide power to loads 14 during operation.

In preferred embodiments, BMS 12 operates, with exceptions and additions as discussed below, in accordance with methods described in U.S. Pat. No. 6,331,762, issued Dec. 18, 2001, entitled ENERGY MANAGEMENT SYSTEM FOR AUTOMOTIVE VEHICLE, which is incorporated herein in its entirety. BMS 12 operates in accordance with one of the present embodiments and measures voltage, a dynamic parameter such as conductance (G), current and temperature of battery 18. These measurements may be periodically carried out and stored in a memory, which can be within BMS 12. Using this stored data, BMS 12 determines a status or condition of battery 18 under a variety of conditions.

As can be seen in FIG. 1, BMS 12 includes a processing circuitry or microprocessor 22 coupled to a voltage sensor 24, a current sensor 26, a forcing function 28 and a temperature sensor 37. Microprocessor 22 may also include one or more inputs and outputs illustrated as I/O 30 adapted to couple to an external databus or to an internal databus associated with the vehicle 10. Further, a user input/output (I/O) 32 is included for providing interaction with a vehicle operator.

The BMS 12 is easily installed in a vehicle electrical system. A single shunt current sensor 26 must be inserted in one of the primary battery cables and, in some embodiments, a control line is provided to allow control of alternator 20. The control can be by simply adjusting the voltage supplied to a voltage regulator of alternator 20 to thereby control charging of battery 18. The BMS 12 can be a separate, self-sufficient and self-contained monitor which operates without requiring interaction with other components of the vehicle except, in some embodiments, alternator 20.

In the present embodiments, microprocessor 22 determines battery conductance in response to inputs, alone or in various functional combinations, from current sensor 26, voltage sensor 24, forcing function 28 and temperature sensor 37. Microprocessor 22 utilizes the conductance, the voltage, the current, the temperature and a time function to determine the real-time status and overall health of the battery under actual and standard conditions. The determination of real-time key information about battery status or condition in an operating vehicle is described in detail further below.

FIG. 1 also illustrates a Kelvin connection formed by connections 36A and 36B to battery 18. With such a Kelvin connection, two couplings are provided to the positive and negative terminals of battery 18. This allows one of the electrical connections on each side of the battery to carry large amounts of current while the other pair of connections can be used to obtain accurate voltage readings. Because substantially no current is flowing through the voltage sensor 24, there will be little voltage drop through the electrical connection between sensor 24 and battery 18 thereby providing more accurate voltage measurements. In various embodiments, the forcing function 28 can be located physically proximate battery 18 or be connected directly to battery 18. In other embodiments, the forcing function 28 is located anywhere within the electrical system of vehicle 10.

In operation, microprocessor 22 is capable of measuring a dynamic parameter of battery 18. As used herein, a dynamic parameter includes any parameter of battery 18 which is measured as a function of a signal having an AC or transient component. Examples of dynamic parameters include dynamic resistance, conductance, admittance, impedance or their combinations. In various aspects of the invention, this measurement can be correlated, either alone or in combination with other measurements or inputs received by microprocessor 22, to the condition or status of battery 18. This correlation can be through testing of various batteries and may be through the use of a lookup table or a functional relationship such as a characterization curve. The relationship can also be adjusted based upon battery construction, type, size or other parameters of battery 18.

In the specific embodiment illustrated in FIG. 1, the forcing function is a function which applies a signal having an AC or transient component to battery 18. The forcing function can be through the application of a load which provides a desired forcing function in which current is drawn from battery 18, or can be through active circuitry in which a current is injected into battery 18. This results in a current labeled $I_F$ in FIG. 1. The total current, $I_T$ through battery 18 is due to both the forcing function current $I_F$ and the current flowing through loads 14, $I_L$. Current sensor 26 is positioned to sense the total current $I_T$. One example battery dynamic parameter, the dynamic conductance (or reciprocally the battery resistance) can be calculated as:

$$G = \Delta I_T / \Delta V \qquad \text{Equation 1}$$

where $\Delta V$ is the change in voltage measured across the battery 18 by voltage sensor 24 and $\Delta I_T$ is the change in total current measured flowing through battery 18 using current sensor 26. The forcing function 28 is provided in order to ensure that the current through battery 18 changes with time. However, in one embodiment, changes in $I_L$ due to loads 14 or the output from alternator 20 can be used alone such that $\Delta I_T = \Delta I_L$ and the forcing function 28 is not required.

As mentioned above, temperature sensor 37 is provided which can be coupled directly to one of the terminals, or exterior surface, of the battery 18 for measuring battery temperature. The temperature sensor 37 can be used in determining the condition of the battery, as battery condition is a function of temperature and can be used in estimating the amount of power which will be required to start the engine of the vehicle. Any type of temperature sensor can be used, for example, a thermistor, thermocouple, RTD, semiconductor or other temperature sensor.

In one embodiment, current sensor 26 comprises a resistance shunt of 250 micro ohms and current through the shunt is determined by measuring the voltage drop across the shunt. However, other types of current measurement techniques can also be used such as Hall effect sensors.

In order to facilitate a better understanding of the concept of the BMS, certain fundamentals of lead-acid batteries are first provided below. Thereafter, an explanation of the function of the BMS using these fundamentals, coupled with the needs of an operating vehicle, are provided. The following description of the BMS is divided into two primary sections: Overall Capability and Process Flow Chart.

Overall Capability

The BMS measures immediate starting and capacity factors as well as long-term health factors and defects in a continuously operating battery system.

Starting

The battery's primary mission is to start the vehicle. To start an internal combustion engine, the battery must deliver a high burst of current for a short period of time with sufficient voltage to spin a starter. Starter motors have their torque directly proportional to the starter current with the rotation speed a function of the voltage above the minimum of the starter voltage drop due to the current and the internal resistance of the starter. The ability to deliver this high rate power is tied to the battery's cranking ability, generally expressed in cold cranking amps (CCA).

The CCA rating measures the ability of a new battery to deliver a constant current for 30 seconds while maintaining the terminal voltage greater than 7.2 volts at 0 degrees Fahrenheit (deg F.), which is equivalent to −18 degrees Celsius (deg C.). The battery CCA is matched to the demands of the vehicle to provide satisfactory starting ability for viable period of time.

When the battery is put into service, it generally has its peak cranking ability. Through use and age degradation, the battery will normally slowly lose its ability to crank over its service life until it can no longer reliably start the vehicle under adverse conditions. At that point it should be replaced with a new battery to attain reliable starting.

As noted above, while there are many devices used to measure batteries, most do not do so while the battery is in continuous service or without interfering with the function of the vehicle. The BMS circumvents those problems.

The core technology of the BMS for assessing the cranking ability of a battery is tied to the measurement of battery conductance. As noted earlier, conductance is a measurement of how battery current changes with respect to voltage. With appropriate factors, it can be directly tied to a battery's cranking power.

$$\text{Conductance}(G) = dI/dV \qquad \text{Equation 2}$$

Where dI is the AC current
dV is the AC voltage

This value can be directly correlated with cranking amps:

$$\text{CCAconductance} = k1 * G \qquad \text{Equation 3}$$

The BMS uses frequency control and filtering to allow measurement of a battery in all modes of vehicle operation—charge, discharge and key-off idle—thus providing a continuous operating system. By attaching the device directly to the battery, the battery is automatically measured continuously over a period of time so as to see the actual trend of power loss.

The BMS is not only capable of measuring the cranking of a charged battery under vehicle operation modes, it can measure it even when the battery is discharged and at temperatures that are much hotter or colder than typical room ambient conditions. It does this by using compensation factors for temperature and discharge that keep the potential battery cranking performance relatively constant even though the battery is undergoing severe changes due to operation and temperature.

$$\text{CCAfc} = \text{CCAconductance} * f(\text{temp}) * f(\text{discharge}) \qquad \text{Equation 4}$$

Where CCAfc is the full-charged CCA

This stable, full-charged cranking amps value can be monitored over time to determine battery degradation. It should be noted that this conductance-based value does not represent the CCA of the battery carried out as a 30-second discharge test. It instead represents the same initial starting characteristics of a battery that would be rated at that CCA value. A battery in service will often lose its ability to sustain a discharge for 30 seconds, but it will deliver the initial power necessary for starting.

Cranking can also be assessed on an instantaneous basis to provide information about the battery's present ability to support starting loads under a variety of conditions. This is done with a multiple factors.

First, the change of the raw conductance factor expressed as CCA can be shown. This decreases with temperature as well as discharge to provide a moving scale. While this is a good number, it does not provide a clear understanding of the relative performance of the battery. An additional measurement compensates conductance CCA for temperature, but not for discharge.

$$\text{CCAcomp} = \text{CCAconductance} * f(\text{temp}) \qquad \text{Equation 5}$$

Where CCAcomp is the CCA compensated for temperature

Second, in standard battery testing for a battery in service, a fully charged battery is discharged for a short time (15 seconds, for example) at half its CCA rating current and must yield a terminal voltage above a minimum for a given temperature. The BMS can provide data akin to this without the need to apply large loads. It does this by combining conductance, temperature and battery voltage factors along with the battery rating to give an estimated instantaneous load voltage. As the battery discharges or gets colder, this voltage is pushed downward; charging or increasing the battery temperature raises the cranking voltage. This predicted voltage gives a strong indication of the cranking voltage should the automobile be immediately subjected to a starting sequence.

$$V\text{pred} = V \text{ at CCArated}/2 \text{ (under present conditions)} \qquad \text{Equation 6}$$

Where Vpred is the predicted voltage at load of ½ the rated CCA

Third, the cranking voltage can also be projected to a full charged state at a standard test temperature (70 deg F.). This is done by compensating the conductance term to full charge and 70 deg F. and applying this to a battery with a full charged voltage and appropriate temperature factors. This also gives a relative voltage that one can compare to the industry standards to give relative state of health data.

$$V\text{pred}FC = V \text{ at CCArated}/2 \text{ (at full charge and } 70 \text{ deg F.)} \qquad \text{Equation 7}$$

Where VpredFC is the predicted voltage at load of ½ the rated CCA

A final cranking factor is a relative comparison of the instantaneous cranking amps under the present conditions compared to the rated current at 0 deg F.

$$\% \text{ Cranking} = \text{Present Cranking Amps/CCArated} \qquad \text{Equation 8}$$

At normal temperatures and at full charge, this term will often show that the starting current a new battery could generate to get the same voltage as a battery subjected to a cold cranking test would be far higher than the rating—typically by a factor of 150% or more. At the standard conditions for the cold test, the battery, when new, should give a value close to 100%. Of course, when there is little or no cranking due to loss of conductance and potential, this cranking scale will measure near 0%. Batteries normally measured under these conditions cannot support any significant current. This scale provides a method to interrelate cranking ability over a wide range of conditions and provides a good indication when the battery will have trouble providing sufficient power to the starting system.

Capacity

The battery must also provide lower rate capacity for electrical system support. This particularly includes times that the charging system is no longer in operation and the battery system provides power for the entire vehicle.

It seems logical that the low-rate capacity of a battery would be easy to calculate, but in actuality discerning this property has been, and continues to be, a challenge to the battery industry.

Traditionally, battery open circuit voltage has often been used as a state of charge (SOC) indicator, but it really only gives an indication of what has already been discharged. Without additional factors, it gives no indication of how much more can be further discharged. Voltage under discharge is affected by many factors and is not linear.

Conductance generally relates to high discharge rates by measuring the strength of the conductive structure of the battery—grids, paste and connectors together with the electrolyte contained between and within the electrodes and within the separator pore structure—for providing a pathway for the transmittance of large currents. A deterioration or change in these components generally limits high rates of current from leaving the battery by absorbing large amounts of power in the ohmic structure. It often can give some indication of low rate capacity, but this relationship is not always strongly correlated.

As a result, capacity information needs to be obtained from complex relationships of multiple factors each time the battery is discharged. The BMS uses a combination of factors to calculate capacity and remaining discharge time.

The first factor used is the capacity derived from all previous predictions. This can be related to $$CAPw = \text{Previous Standard Capacity} * f(A) * f(temp) \quad \text{Equation 9}$$

Where CAPw is the working capacity of the battery at a given rate and temperature
f(A) is a function of the discharge current
f(temp) is a function of the temperature Time remaining can be calculated using the previous capacity estimate under the prevailing conditions reduced by the amount of discharge and dividing the difference by the discharge rate:

$$TR = (CAPw + DCHG)/(-A) \quad \text{Equation 10}$$

Where TR is the discharge time remaining to 10.5V
CAPw is the estimated working capacity
DCHG=the amount of discharge (negative)
A=the discharge current or previous average discharge A The second capacity factor is derived from a remaining discharge time calculation using voltage, current and conductance:

$$TRcalc = k2 * PF * Cp * (V-10.5)^2/(-A)^{PN} \quad \text{Equation 11}$$

Where TRcalc is the calculated time remaining
k2=a proportionality constant
PF=f(CCAcomp, CCAnom, CSOH)
Cp=the calculated Peukert capacity ($Cp = A^{PN} * t$)
V=voltage corrected for conductance losses
A=the discharge current
PN=Peukert exponent number The calculated remaining time is a complex factor that attempts to predict the remaining time to 10.5V, the standard cutoff voltage for low rate discharges. It is seen that this equation will go to "0" when the battery voltage hits 10.5V. This equation can only be used in restrictive ranges. For instance, below 10.5V, this calculation is no longer made because the end of discharge has already occurred. Likewise, if there is no significant current being discharged, the time remaining will go to a very high number that is meaningless in practical operations.

These two expressions are combined to give a revised estimate of the time remaining TR. The unique way the BMS does this is by using a fraction based on the estimated remaining time from the beginning of the discharge. At the beginning, the data from the previous capacity (TR) will dominate while at the end of the discharge the calculated factor will dominate.

This value in turn can be recursively used to recalculate working capacity using:

$$CAPw = -(TR * A + DCHG) \quad \text{Equation 12}$$

Where CAPw is the new working capacity
A is the present discharge amps (negative)
DCHG is the amount of discharge (negative)

This value can then be used to calculate standard capacity figures:

$$Cp = CAPw * (-A)^{PN-1} * f(temp) \quad \text{Equation 13}$$

Where Cp is the Peukert relationship capacity
CAPw is the working capacity
A is the discharge current
PN is the Peukert exponent for the battery type
f(temp) is a temperature compensating function To prevent large excursions of capacity, the above value is buffered with a weighted moving average.

With a value for Cp, other standard measures of capacity can be calculated:

$$C20 = (Cp * 20^{(PN-1)})^{(1/PN)} \quad \text{Equation 14}$$

Where C20 is the Ah capacity at a 20 hr discharge rate at 25 C
Cp is the Peukert capacity
PN is the Peukert exponent Health Factors The above information can be used to assess the health of the battery by comparison to rated or adjusted rated values for the battery.

The first factor deals with cranking:

$$CSOH = CCAfc/CCAnom * 100\% \quad \text{Equation 15}$$

Where CSOH is the Cranking State of Health
CCAfc is the calculated full charged CCA
CCAnom is the rated CCA adjusted for conductance This factor should not change quickly since it is meant to show changes over the life of the battery. It is therefore buffered with a weighted moving average. The value shows how much cranking remains under full charged standard conditions.

The second factor deals with low rate capacity:

$$RSOH = C20/CAPrated * 100\% \quad \text{Equation 16}$$

Where RSOH is the Reserve State of Health
C20 is the 20-hour capacity
CAPrated is the rated 20-hour capacity This factor should also not change quickly and is also buffered with a weighted moving average. The value shows how much standard low rate capacity remains on a percentage scale.

The final factor combines the above two factors to assess the remaining life of the battery. It is generally accepted that cranking batteries fail when they lose 30-40% of their cranking performance. At this point, the structure of the battery can no longer reliably deliver power and the battery begins to fail rapidly. Low rate capacity is somewhat more arbitrary because a certain capacity may be needed to fulfill the mission. In general for cranking applications, if the RSOH drops below 50%, the battery may be considered to be a failure. Therefore, an overall life factor can be generated by assessing each health factor and using the minimum factor to determine remaining life:

$$SOL = \text{minimum}[(CSOH-35)/0.35 \text{ or } (RSOH-50)/0.5] \quad \text{Equation 17}$$

Where SOL is the State of Life
CSOH is the Cranking State of Health
RSOH is the Reserve State of Health
Minimum is the lesser of the two expressions Defects and Externally-Generated Conditions The BMS has capabilities of detecting defects in a battery. Besides the gradual deterioration that determines end of life, a battery can undergo rapid deterioration due to a number of faults. Each of these are detected in the following manner:

Shorting is detected in a number of manners.
    First, it is detected in the idle mode when the voltage is very low (<11V) but still retains a sizeable amount of conductance. This indicates that the battery was not simply discharged.
    Second, it is detected if there is a sizeable deviation in the voltage from the expected OCV in idle mode.
    Third, it is detected through a large charge current at normal charging voltage.

An open circuit is detected with very low conductance at normal voltage levels.
    Sulfation is an externally-generated condition in which the battery has the inability to accept adequate charge even though the charging system is operating normally. It is generally the result of a prolonged storage of a battery in a discharged condition. While there are no industry-accepted standards for this sulfation, it is being identified by detecting that the current is below an acceptable charging level when the battery SOC is below 80%. Sulfation is a condition rather than a defect because it is generally caused by factors external to the battery. It can often be reversed with prolonged low rate charging.
    Overcharge is also an externally-generated that is detected by measuring the Ah of overcharge at high voltage once the battery has reached full charge. This is also not a battery defect, but a fault of the charging system that must be corrected.

Operation

The BMS continually updates the data (time, current, voltage, temperature, conductance) necessary to generate the various battery factors. Calculations are made in general and in particular modes of battery operation (charge, discharge, idle). Using the data, the mode of operation is assessed and the various routines are accessed for that mode.

In all cases, before factors relating to cranking, capacity and life are projected, the battery must be in a stable state—that is, the amount of discharge on the battery must be known. Projections of key factors with an uncertain amount of discharge will give unreliable results.

In general, the battery can be stable in two ways:
    If the battery nears full charge
    If the battery has settled to an stable equilibrium voltage In the first case, there is no discharge so that is a preferred method. In the second case, the battery may be discharged, but the amount can be calculated accurately.

Process Flow Chart

Figure 2:
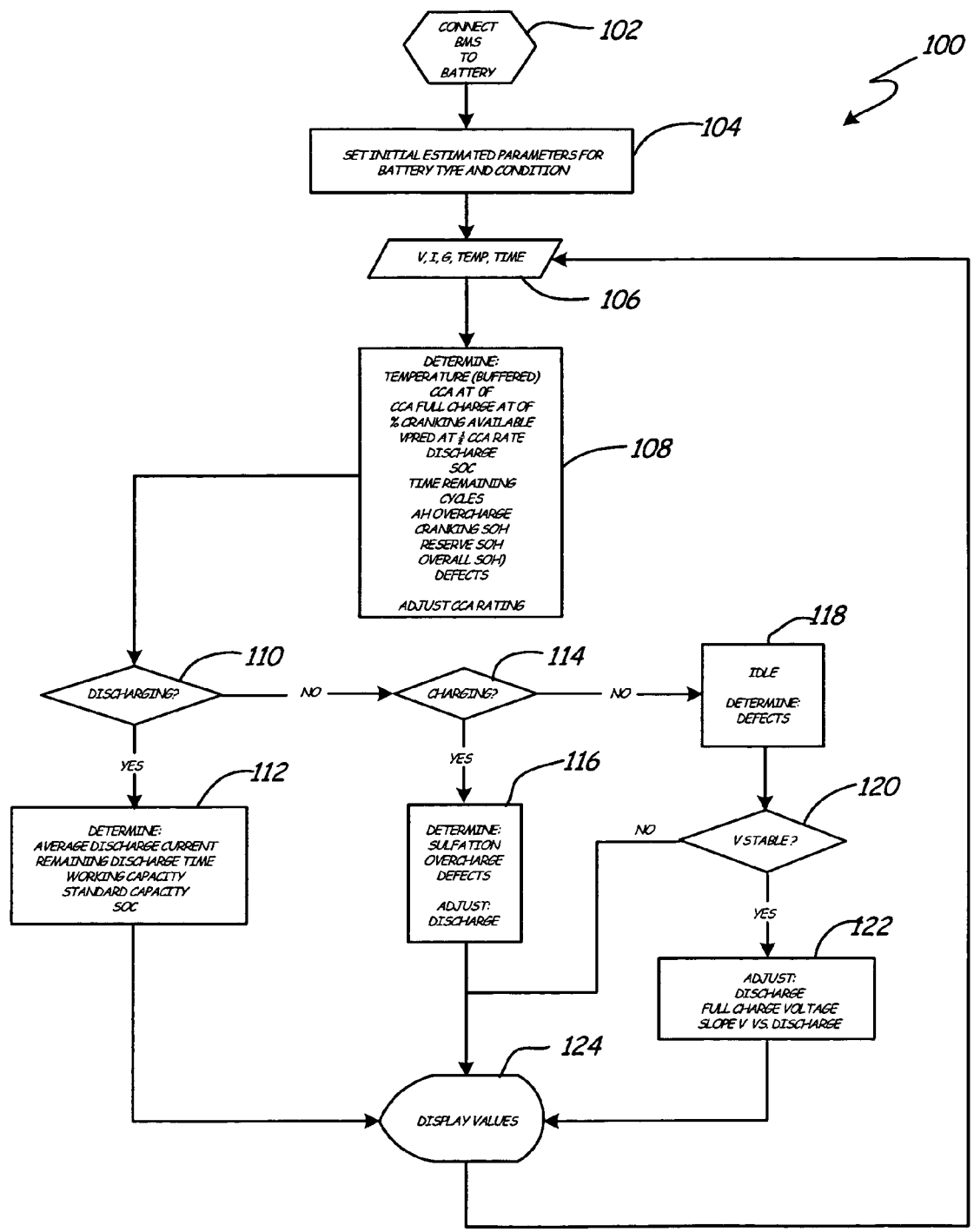
FIG. 2 is a flowchart showing steps of a method of monitoring a vehicle battery in accordance with one of the present embodiments.

FIG. 2 is a flowchart 100 showing steps of an example overall battery monitoring process that can be carried out, for example, by the BMS shown in FIG. 1. At step 102, the BMS is electrically connected to the battery. At step 104, initial estimated parameters for battery type and condition are set. At step 106, a voltage, current, conductance and temperate of the battery are measured/obtained. Also, at step 106, a time value is obtained. At step 108, utilizing the voltage, current, conductance, temperature and time values obtained in step 106, temperature (buffered), CCA at 0 deg F., CCA full charge at 0 deg F., % cranking available, Vpred at ½ CCA rate, Vpred at full charge and 70 deg F., discharge, SOC, time remaining, cycles, Ah Overcharge, cranking SOH, reserve SOH, overall SOH and defects, are determined. Also, at this step, adjustments are made in connection with a CCA rating. At step 110, a determination is made as to whether the battery is discharging. If the battery is discharging, control is passed to step 112 at which average discharge current, remaining discharge time, working capacity, standard capacity and SOC of the battery are determined. If the battery is not discharging, control is passed to step 114 at which a determination is made as to whether the battery is charging. If the battery is charging, at step 116 a determination is made regarding sulfation, overcharge and defects in connection with the battery. Also, at this step, an adjustment is made for battery discharge. If the battery is neither discharging nor charging (that is, the battery is idle) control passes to step 118 at which the battery is checked for defects. A determination is then made, at step 120, as to whether the battery voltage (V) is stable. If V is stable, control passes to step 122 at which discharge, full charge voltage and slope of V versus discharge is adjusted. From steps 112, 116 and 122, and if V is not stable, control passes to step 124 at which different values that reflect battery status or condition are displayed. Since the battery monitoring process is substantially continuous, steps 106 through 124 are carried out iteratively. A device such as BMS 12, with a microprocessor such as 22, is programmed to carry out the computations described in FIG. 2 based substantially on equations 1-17 included earlier.

In essence, the above-described embodiments are capable of determining an operational condition of the battery, independently of a current state of the battery, as a function of the battery voltage, the battery current, the dynamic parameter of the battery and the battery temperature. By "independently of a current state of the battery" it is meant that the battery is projected to standard conditions with which it can be compared directly with the original ratings of the battery for cranking performance and capacity. For example, the battery is compensated to full charge and then compared to its full charged properties at a given temperature to the ratings of the battery. For cold cranking, that battery would be evaluated at full charge and the temperature would be 0 deg F. For Ah capacity, the battery would be evaluated full charged at 25 deg C. Once those standardized values are projected, an assessment of how much the battery has lost is made in each of these categories without bringing in the variability due to operational variables like temperature and discharge.

Although the present invention has been described with reference to preferred embodiments, workers skilled in the art will recognize that changes may be made in form and detail without departing from the spirit and scope of the invention.

What is claimed is:

1. A method of monitoring a battery comprising:
    (a) measuring a voltage of the battery;
    (b) measuring a current of the battery;
    (c) measuring a dynamic parameter of the battery;
    (d) obtaining a temperature of the battery;
    (e) determining an operational condition of the battery, independently of a current state of the battery by projecting the battery to standard conditions, as a function of the battery voltage, the battery current, the dynamic parameter of the battery and the battery temperature; and
    (f) repeating steps (a) through (e) iteratively, and outputting battery condition information at the end of each iteration,
    wherein projecting the battery to standard conditions comprises compensating the battery to full charge.

2. The method of claim 1 wherein determining an operational condition of the battery in accordance with step (e) comprises determining a present cranking ability of the battery.

3. The method of claim 1 wherein determining an operational condition of the battery in accordance with step (e) comprises determining a sulfation condition of the battery.

4. The method of claim 1 wherein determining an operational condition of the battery in accordance with step (e) comprises determining whether defects are present in the battery.

5. The method of claim 1 wherein determining an operational condition of the battery in accordance with step (e) comprises determining a state of health and a state of life of the battery.

6. The method of claim 5 wherein determining a state of health of the battery comprises determining a battery cranking state of health and a battery reserve state of health.

7. The method of claim 1 wherein determining an operational condition of the battery in accordance with step (e) comprises determining battery discharge, battery state of charge, battery predicted discharge voltage, battery predicted discharge voltage at full charge, battery conductance CCA adjusted for temperature, battery conductance CCA adjusted for temperature and discharge, battery working capacity, battery percent cranking, battery 20-hour capacity, battery cycles and battery discharge time remaining.

8. The method of claim 1 wherein the dynamic parameter measurement step (c) comprises determining a response of the battery to an applied current pulse.

9. The method of claim 1 wherein the measured battery dynamic parameter is one of battery conductance and battery resistance.

10. The method of claim 1 and further comprising utilizing saved battery information from prior iterations to determine battery condition.

11. An apparatus comprising:
a positive connector coupled to a positive terminal of the battery;
a negative connector coupled to a negative terminal of the battery;
a voltage sensor configured to measure a voltage of the battery;
a temperature sensor configured to measure a temperature of the battery;
a current sensor configured to measure a battery current; and
(g) processing circuitry configured to measure a dynamic parameter of the battery using the first and second connectors, and to determine an operational condition of the battery, independently of a current state of the battery by projecting the battery to standard conditions, as a function of the battery voltage, the battery current, the dynamic parameter of the battery and the battery temperature,
wherein projecting the battery to standard conditions comprises compensating the battery to full charge.

12. The apparatus of claim 11 wherein determining an operational condition of the battery comprises determining a present cranking ability of the battery.

13. The apparatus of claim 11 wherein determining an operational condition of the battery comprises determining a sulfation condition of the battery.

14. The apparatus of claim 11 wherein determining an operational condition of the battery comprises determining whether defects are present in the battery.

15. The apparatus of claim 11 wherein determining an operational condition of the battery comprises determining a state of health and a state of life of the battery.

16. The apparatus of claim 15 wherein determining a state of health of the battery comprises determining a battery cranking state of health and a battery reserve state of health.

17. The apparatus of claim 11 wherein determining an operational condition of the battery comprises determining battery discharge, battery state of charge, battery predicted discharge voltage, battery predicted discharge voltage at full charge, battery conductance CCA adjusted for temperature, battery conductance CCA adjusted for temperature and discharge, battery percent cranking, battery working capacity, battery 20-hour capacity, battery cycles and battery discharge time remaining.

18. The apparatus of claim 11 wherein measuring the dynamic parameter is carried out by determining a response of the battery to an applied current pulse.

19. The apparatus of claim 11 wherein the measured battery dynamic parameter is one of battery conductance and battery resistance.

20. A method of monitoring a battery comprising:
(a) measuring a voltage of the battery;
(b) measuring a current of the battery;
(c) measuring a dynamic parameter of the battery;
(d) obtaining a temperature of the battery;
(e) determining a condition of the battery, independently of a current state of the battery by projecting the battery to a standard conditions, as a function of the battery voltage, the battery current, the dynamic parameter of the battery and the battery temperature, wherein determining the condition of the battery comprises determining battery state of life, battery cranking state of health, battery reserve state of health, battery defects, battery discharge, battery state of charge, battery predicted discharge voltage, battery predicted discharge voltage at full charge, battery conductance CCA adjusted for temperature, battery conductance CCA adjusted for temperature and discharge, battery % cranking, battery working capacity, battery 20-hour capacity, battery cycles, battery discharge time remaining; and
(f) repeating steps (a) through (e) iteratively, and outputting battery condition information at the end of each iteration, wherein projecting the battery to standard conditions comprises compensating the battery to full charge.

* * * * *